United States Patent [19]

Langenkamp

[11] Patent Number: 5,038,118
[45] Date of Patent: Aug. 6, 1991

[54] CIRCUIT CONFIGURATION FOR AN INTEGRATABLE AND CONTROLLABLE RING OSCILLATOR

[75] Inventor: Ulrich Langenkamp, Ottobrunn, Fed. Rep. of Germany

[73] Assignee: Siemens Aktiengesellschaft, Munich, Fed. Rep. of Germany

[21] Appl. No.: 578,029

[22] Filed: Sep. 5, 1990

[30] Foreign Application Priority Data

Sep. 5, 1989 [EP] European Pat. Off. ........ 89116383.4

[51] Int. Cl.$^5$ ............................................. H03B 5/24
[52] U.S. Cl. .................................. 331/57; 331/108 B; 331/111; 331/177 R
[58] Field of Search ...................... 331/57, 108 B, 111, 331/135, 136, 177 R, 34

[56] References Cited

U.S. PATENT DOCUMENTS 3,708,757  1/1973  Savarese et al. ............... 331/57
4,910,471  3/1990  Brahmbhatt et al. ............ 331/57

FOREIGN PATENT DOCUMENTS 0144636  6/1985  European Pat. Off. .
0243878  11/1987 European Pat. Off. .
0322047  6/1989  European Pat. Off. .

OTHER PUBLICATIONS

Electronic Letters, Jun. 5, 1986, vol. 22, No. 12, pp. 677 to 679, Syed et al., "Gigahertz Voltage-Controlled Ring Oscillator".
German Publication: Semiconductor Circuitry, Tietze and Schenk, 5th Ed., 1980, pp. 701-703.
Wireless World, Dec. 1971, "Linear Ramp Generator", J. B. F. Cairns, pp. 604-605.

Primary Examiner—Siegfried H. Grimm
Attorney, Agent, or Firm—Herbert L. Lerner; Laurence A. Greenberg

[57] ABSTRACT

A circuit configuration of an integratable and controllable ring oscillator for generating a clock signal includes first and second stages being connected between supply terminals and having input and output terminals. The output terminal of the first stage is connected to the input terminal of the second stage. An inverter is connected between the output terminal of the second stage and the input terminal of the first stage. The input terminal of the second stage supplies a clock signal. Each of the stages includes first and second transistors having load paths connected between the supply terminals in a series circuit with a connecting point between the transistors. The second transistor has a gate terminal connected to the input terminal. The first transistor determines the frequency of the clock signal, is controllable in accordance with a control variable and acts as a current source. A capacitor has one terminal connected to the connecting point and another terminal connected to a fixed potential. A decoupling stage is connected between the output terminal and the connecting point.

12 Claims, 3 Drawing Sheets

CIRCUIT CONFIGURATION FOR AN INTEGRATABLE AND CONTROLLABLE RING OSCILLATOR

The invention relates to a circuit configuration for an integratable and controllable ring oscillator for generating a clock signal, having a first stage with an output terminal to which an input terminal of a second stage is connected, and supply terminals between which both stages are connected.

Controllable oscillators are well known, and are used preferentially in phase-locked loops (PLL). Reference is made concerning this point to the publication Halbleiter-Schaltungstechnik [Semiconductor Circuitry] by Tietze and Schenk, 5th ed., 1980, pp. 701–703, for instance. Controllable oscillators may be either voltage-controlled (VCO) or current-controlled (ICO). As an example, controllable oscillators of that type are made in the form of ring oscillators or bistable multivibrators, in which the time constants are set by means of RC combinations. The resistor R is variable through a control voltage.

A voltage-controlled ring oscillator with RC time constants is known, for instance, from Electronics Letters, 1986, Vol 22, No. 12, pp. 677-679. The ring oscillator shown in FIG. 1 has an odd number of inverter stages connected in series. Each inverter stage is preceded by a MOSFET, which acts as a controllable resistor, controls the RC time constant and has its gate terminal connected to a common control line. Reference symbol C represents the input impedance of each inverter. The output of the final inverter stage is fed back to the load path of the first FET. The frequency of the clock signal that can be picked up or tapped at the ring oscillator is dependent on the control voltage applied to the MOSFETs.

In order to cover the frequency range of the phase-locked loop in all operating states of the control range of the controllable oscillator, it is often necessary, because of the influence of production tolerances or temperature dependencies, to make the control range of the controllable oscillator markedly wider than the operating range of the phase-locked loop. However, that increases the control steepness, which necessarily leads to poorer control and thus entails greater filter expense. A non-linear characteristic curve of the controllable oscillator also has an unfavorable effect. If only an asymmetrical output signal is available at the output of the controllable oscillator, because of production tolerances, temperature dependency or the non-linear characteristic curve, or in other words if only an output signal having a make-break ratio which is not equal to one is available, further processing of the signal may become problematic. Yet if only an asymmetrical output signal is attainable by the controllable oscillator, then it is possible to cause the controllable oscillator to vibrate at twice the frequency and then to divide the output signal by the factor of 2 in a frequency divider stage, in order to make the output signal of the controllable oscillator symmetrical.

Depending on the production technology of the generally integrated circuit being used, such a provision becomes particularly problematic if the switching behavior is substantially co-determined by parasitic components of the controllable oscillator.

In the ring oscillators or bistable multivibrators referred to initially above, the frequency of the clock signal that can be tapped at the output is dependent on the control voltage applied at the gate terminals of the MOS transistors. However, variations in the threshold voltage, the mobility of the charge carriers and the geometry of the transistors because of manufacturing tolerances and/or temperature dependencies, affect the frequency of the clock signal and naturally that is undesirable.

Another option for making controlled oscillators, for instance by CMOS technology, is to charge and discharge a capacitor uniformly with the aid of a current mirror. A symmetrical clock signal can be produced in that way in combination with a hysteresis inverter, or in other words a Schmitt trigger stage. However, tolerance problems arise with controllable oscillators of that type, because the oscillator frequency is linearly dependent on the magnitude of the hysteresis.

It is accordingly an object of the invention to provide a circuit configuration for an integratable and controllable ring oscillator, which overcomes the hereinafore-mentioned disadvantages of the heretofore-known devices of this general type, that is simple to manufacture, has a linear characteristic curve, and delivers an output clock signal which has as symmetrical a make-break ratio as possible.

With the foregoing and other objects in view there is provided, in accordance with the invention, a circuit configuration of an integratable and controllable ring oscillator for generating a clock signal, comprising first and second stages being connected between supply terminals and having input and output terminals, the output terminal of the first stage being connected to the input terminal of the second stage, an inverter connected between the output terminal of the second stage and the input terminal of the first stage, and the input terminal of the second stage supplying a clock signal; each of the stages including at least first and second transistors having load paths connected between the supply terminals in a series circuit with a connecting point between the transistors, the second transistor having a gate terminal connected to the input terminal, the first transistor determining the frequency of the clock signal, being controllable in accordance with a control variable and acting as a current source, a capacitor having one terminal connected to the connecting point and another terminal connected to a fixed potential, and a decoupling stage connected between the output terminal and the connecting point.

In accordance with another feature of the invention, one of the supply terminals is to be applied to a positive potential and is connected to the second transistor and to the other terminal of the capacitor in each of the stages.

In accordance with a further feature of the invention, in each of the stages, one of the supply terminals is to be applied to a positive potential and is connected to the second transistor, and the other of the supply terminals is to be applied to ground potential and is connected to the other terminal of the capacitor.

In accordance with an added feature of the invention, each stage has a control input terminal acted upon by the control variable, and the first transistor of each stage has a gate terminal connected to the control input terminal.

In accordance with an additional feature of the invention, the control variable is a control current or control voltage.

In accordance with yet another feature of the invention, the decoupling stage has at least one inverter stage connected between the supply terminals.

In accordance with yet a further feature of the invention, there is provided another control input terminal being acted upon by a variable dependent on a supply voltage of the ring oscillator, and a third transistor being connected parallel to the first transistor and having a gate terminal connected to the other control input terminal.

In accordance with yet an added feature of the invention, the capacitor is an MOS transistor having a gate terminal forming one terminal of the capacitor and a short-circuited load path forming the other terminal of the capacitor.

In accordance with yet an additional feature of the invention, the transistors are NMOS transistors.

In accordance with a concomitant feature of the invention, there is provided a semiconductor body on which the circuit configuration is integrated.

The circuit configuration for a ring oscillator according to the invention is accordingly substantially based on controlling the charge reversal of the capacitors present in both stages with a defined current. A particularly advantageous feature of the circuit configuration for a ring oscillator according to the invention is that the capacitance and currents are highly replicable variables and exhibit only slight tolerances and a slight temperature dependency. Good adaptation of the control range of the ring oscillator to the range required by the phase-locked loop is accordingly attained.

Other features which are considered as characteristic for the invention are set forth in the appended claims.

Although the invention is illustrated and described herein as embodied in a circuit configuration for an integratable and controllable ring oscillator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 4:
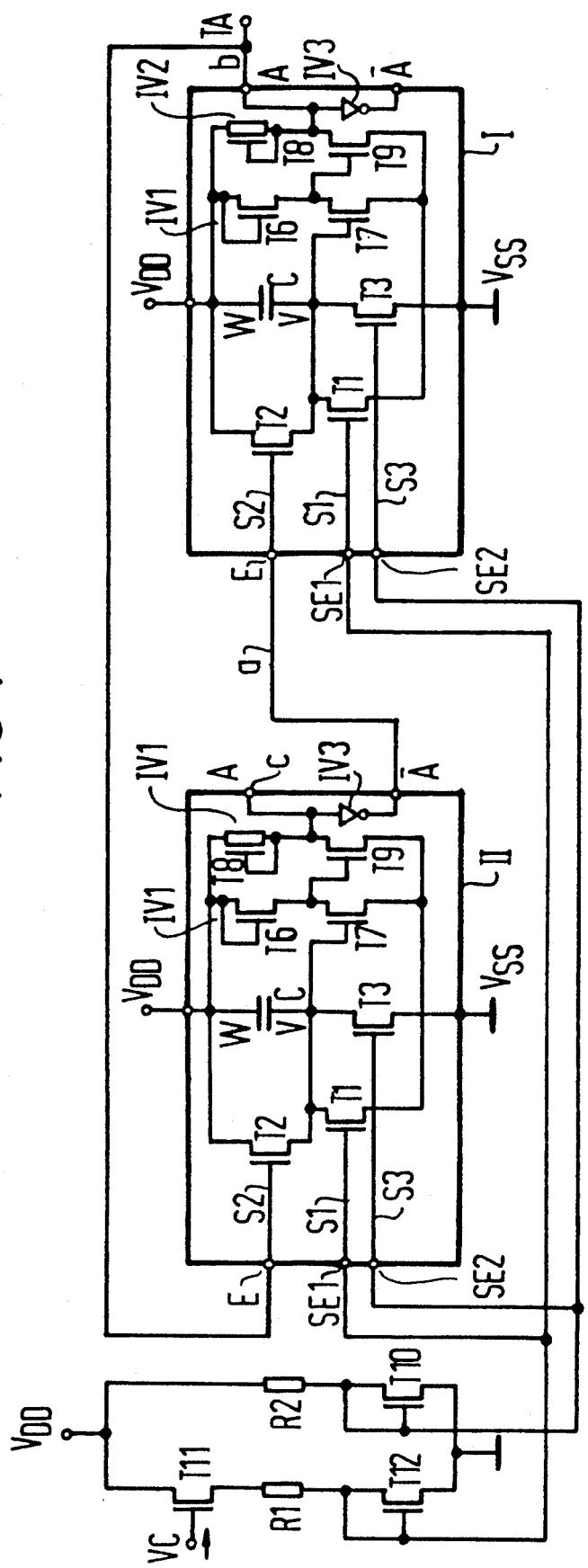
Figure 5:
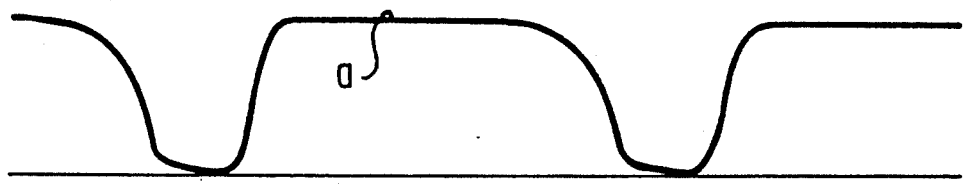
Figure 5:
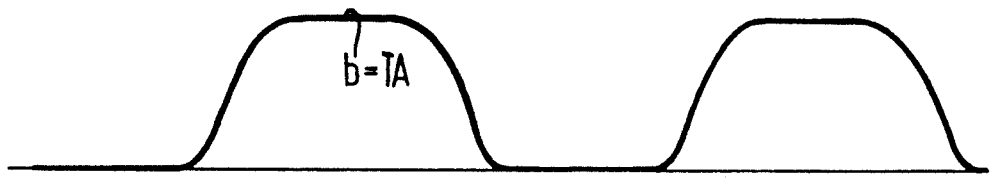
Figure 5:
Figure 5:
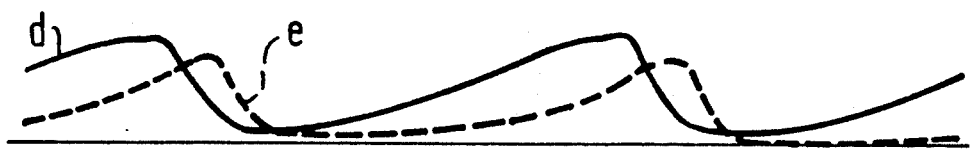
Figure 5:
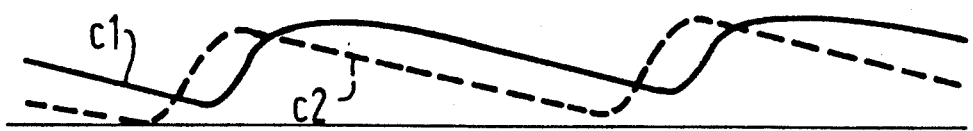

FIG. 4 is a circuit diagram of an exemplary embodiment of a more-detailed circuit configuration of a ring oscillator according to the invention, having a voltage-controlled current source for adjusting the frequency of a clock signal that can be tapped at the ring oscillator; and FIG. 5 is a graph of a diagram showing the course over time of voltages occurring in the circuit configuration of FIG. 4.

Figure 1:
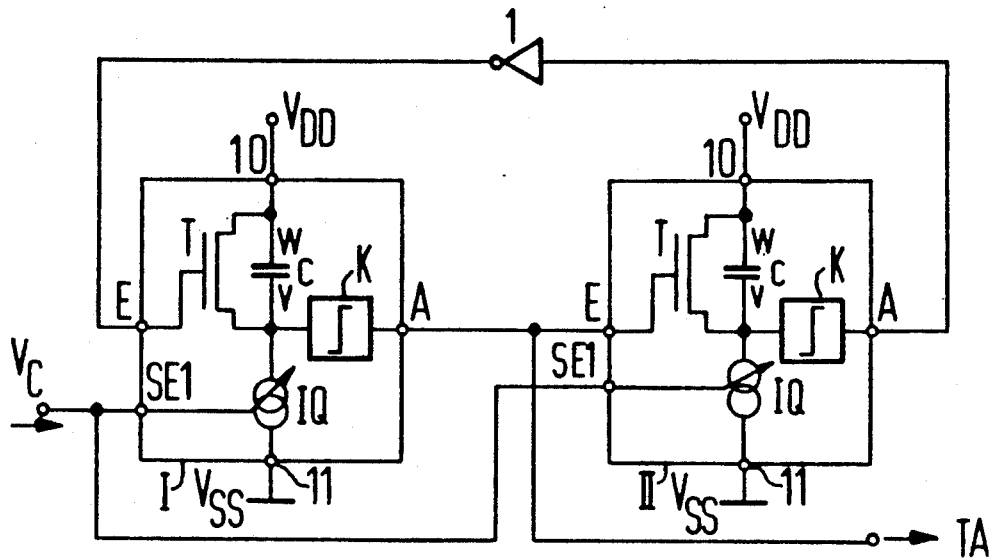
FIG. 1 is a basic schematic circuit diagram of a circuit configuration according to the invention for a two-stage ring oscillator.

Referring now to the figures of the drawings in detail and first, particularly, to FIG. 1 thereof, there is seen a basic circuit diagram of a circuit configuration for a ring oscillator according to the invention. The ring oscillator has two series-connected stages I, II, both of which are connected between two supply terminals 10, 11, to which a positive potential $V_{DD}$ and ground potential $V_{SS}$ are applied. An output terminal A of the first stage I is connected to an input terminal E of the second stage II. An output terminal A of the second stage II is connected through an inverter 1 to an input terminal E of the first stage I. Each of the two stages I, II has a control input SE1. The control inputs SE1 can both be acted upon by a control variable $V_C$ in order to vary the frequency of a output clock signal TA of the ring oscillator that can be tapped at the input terminal E of the second stage II.

Each of the two stages I, II in principle has a series circuit connected between the supply terminals 10 and 11, which is formed of a current source IQ that is controllable in accordance with the control variable $V_C$ applied to the control input SE1, and a load path of a transistor T having a gate terminal which is connected to the input terminal E of the applicable stage I, II. As is also shown in FIG. 1, a decoupling stage K is connected between the output terminal A of each of the stages I, II and the connection point between the current source IQ and the transistor T. Each of the stages I, II also has a capacitor C, which has one terminal v connected to the connection point between the transistor T and the current source IQ and another terminal w connected to a fixed potential. Some possible circuitry embodiments of these stages I, II will described in further detail below in conjunction with FIGS. 2 and 3.

Figure 2:
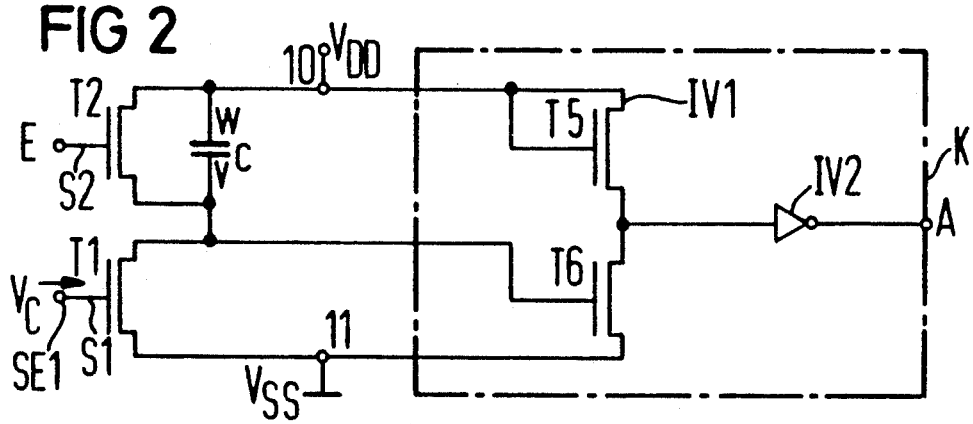
FIG. 2 is a circuit diagram of a first exemplary embodiment of a circuit configuration for one stage having a capacitor applied to a positive potential.

FIG. 2 shows one possible exemplary embodiment of a realization of the circuitry of the stages I, II, with a capacitor C connected to a positive potential $V_{DD}$. In detail, the circuit configuration of FIG. 2 has a series circuit of load paths of a first transistor T1 and a second transistor T2. The series circuit is connected between the supply terminals 10 and 11. The first transistor T1 is connected to ground potential $V_{SS}$ and has a gate terminal S1 that is connected to the control input terminal SE1, while the gate terminal S2 of the second transistor T2 is connected to the input terminal E. A capacitor C is connected parallel to the load path of the second transistor T2. The connection point between the first transistor T1 and second transistor T2 is connected to the input of a first inverter stage IV1 of the decoupling stage K, which includes two further transistor T5, T6. The output of the inverter stage is connected to the output terminal A, through a second or further inverter stage IV2.

Figure 3:
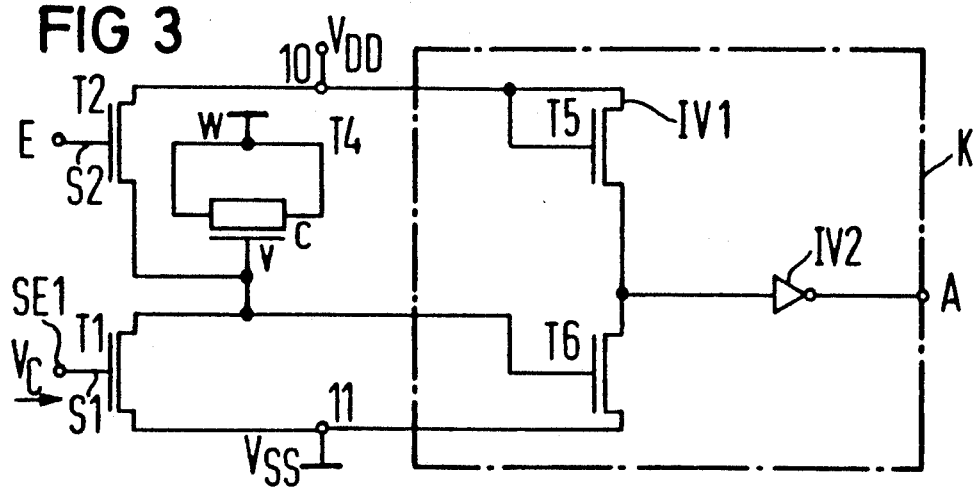
FIG. 3 is a circuit diagram of a second exemplary embodiment of a circuit configuration for a stage having a capacitor applied to ground potential.

A second exemplary embodiment of a realization for the circuitry of a stage I or II can be seen in FIG. 3. The same reference numerals as above continue to be used for the same elements. This exemplary embodiment only differs from that of FIG. 2 due to the fact that the capacitor C is connected to ground potential $V_{SS}$ by its terminal w that is not connected to the connecting point between the first transistor T1 and the second transistor T2. In this exemplary embodiment, the capacitor C is a depletion MOSFET, having a gate terminal which is connected to the connecting point between the first transistor T1 and the second transistor T2, and a load path which is short-circuited and is connected to ground potential $V_{SS}$.

It should also be noted in this case that the first stage I and the second stage II must be constructed identically. This means that the first stage I and second stage II of the ring oscillator must either both have the circuit configuration shown in FIG. 2 or both have the circuit configuration shown in FIG. 3. One essential advantage of constructing the switching stages I, II in accordance with the invention is that identical enhancement MOSFETs can be used, which have threshold voltage variations that only have a slight effect on the recovery time of the stages I, II. Even a change in the supply voltage has little effect, because if the decoupling stage K is suitably dimensioned, its switching threshold changes and compensatingly counteracts a change in the supply voltage.

In FIG. 4, a circuit configuration for a ring oscillator of the invention is presented having a voltage-controlled current source for adjusting the output frequency of the clock signal TA. The reference numerals used above continue to be used for identical parts. Each of the two stages I and II is constructed, for instance, in the form of the circuit configuration presented in FIG. 2. However, the second inverter stage IV2 is formed of two series-connected transistors T8 and T9. The transistor T8 which is connected to the positive potential $V_{DD}$ is constructed as a depletion MOSFET. The other transistors T1, T2, T3, T6, T7, T9 are enhancement MOSFETs. The connecting point between the two transistors T6 and T7 is connected to the gate terminal of the transistor T9. The output of the second inverter stage IV2 in this exemplary embodiment is connected both to the output terminal A of the applicable stage I, II and through a third inverter stage IV3 to an inverting output terminal $\overline{A}$. In contrast to the embodiment of stages I, II shown in FIG. 2, a further transistor T3 is connected parallel to the first transistor T1 in FIG. 4, and has a gate terminal S3 connected to a second or other control input SE2. The gate terminal S1 of the first transistor T1 is connected to the first control input terminal SE1. The control current that determines the frequency of the output clock signal of the ring oscillator is split by these two transistors T1 and T3 into one variable component and one constant component. To this end, the second control input terminal SE2 is connected to the connecting point of a voltage divider, which is formed of a series circuit of a resistor R2 and a transistor T10 wired as a resistor. The series circuit of the resistor R2 and the transistor T10 is applied to both potentials $V_{DD}$ and $V_{SS}$. The variable control current is supplied to the first control input terminal SE1. For this purpose, the circuit configuration may, for instance, have a series circuit being disposed between the potentials $V_{DD}$ and $V_{SS}$ and being formed of another transistor T11, a resistor R1, and a further resistor T12. A control voltage $V_C$, which is derived from the PLL, for instance, is supplied to the gate terminal of the transistor T11.

Constructing the circuit configuration of FIG. 4 in accordance with the invention offers the opportunity of compensating for fluctuations in the supply voltage, by splitting the control current as shown into a variable component and a constant component. If the constant component is derived from the supply voltage, then an increase in the supply voltage leads to an increase in the control current, and vice versa. As a result, a change in the recovery times in the stages caused by changes in the supply voltage can be effectively avoided. In general, the control inputs SE1, SE2 of each stage I, II are components of a current mirror circuit, with which a control current controls the current sources of the CI time constants. If a control voltage is available instead of a control current, as in FIG. 4, then it can be converted into a control current by means of a current-/voltage converter.

FIG. 5 shows the signal course of FIG. 4 for a clock frequency of 14.7 MHz. The signal at the input terminal E of the first stage I is represented by the symbol a, and a clock signal b can be tapped at its output terminal A. This clock signal b is at the same time the output signal TA of the ring oscillator, which is fed back to the input terminal E of the second stage II. A signal c is present at the output terminal A of this second stage II. The signal which is inverted with respect to the signal c can be tapped at the output terminal $\overline{A}$ of the second stage II and is equivalent to the signal course of the signal a. Charging and discharging of the capacitor C of the first stage I is indicated at C1, and charging and discharging of the capacitor of the second stage II is shown at C2. The output voltage of the first inverter stage IV1 in the first stage I is indicated by reference symbol d, while the output voltage of the first inverter stage IV1 and the second stage II is indicated by reference symbol e. It is clearly seen that the circuit configuration for the ring oscillator according to the invention has a highly symmetrical output signal. As FIG. 5 shows, the capacitor must be discharged very quickly in comparison with its charge time. This is necessary because the discharging process in the configuration shown in FIGS. 2 and 4 is dependent on both the temperature and production tolerances. If the discharging time is kept as short as possible, then the tolerances of the discharging time can have only little influence on the frequency of the ring oscillator clock signal. The charging time, which is longer in contrast to the discharging time, is monitorable by the current mirror. The charging time of the capacitor determines the frequency of the ring oscillator clock signal.

In contrast, in the circuit configuration of FIG. 3, in which the capacitor is at ground potential, the charging time must be as short as possible, so that tolerances in the charging time will have little influence on the frequency of the ring oscillator clock signal. In the circuit configuration presented in FIG. 3, the discharging of the capacitor is monitored by the current mirror.

With the circuit configuration for a ring oscillator according to the invention, a controllable oscillator that furnishes a clock signal with a symmetrical make-break ratio can be produced with small tolerances. The circuit configuration according to the invention is particularly well suited for manufacture by MOS technology and in particular NMOS technology. If NMOS technology is used, then the charging and discharging currents may deviate considerably from one another because of tolerances. However, since only the charging or discharging currents are used for adjusting the clock frequency of the ring oscillator in the circuit configuration presented in this case, these tolerances are unimportant. Thus a symmetrical clock output signal is attainable even in NMOS technology.

I claim:

1. Circuit configuration of an integratable and controllable ring oscillator for generating a clock signal, comprising:

first and second stages being connected between supply terminals and having input and output terminals, said output terminal of said first stage being connected to said input terminal of said second stage, an inverter connected between said output terminal of said second stage and said input terminal of said first stage, and said input terminal of said second stage supplying a clock signal;

each of said stages including first and second transistors having load paths connected between said supply terminals in a series circuit with a connecting point between said transistors, said second transistor having a gate terminal connected to said input terminal, said first transistor determining the frequency of the clock signal, being controllable in accordance with a control variable and acting as a current source, a capacitor having one terminal connected to said connecting point and another terminal connected to a fixed potential, and a decoupling stage connected between said output terminal and said connecting point.

2. Circuit configuration according to claim 1, wherein one of said supply terminals is to be applied to a positive potential and is connected to said second transistor and to said other terminal of said capacitor in each of the stages.

3. Circuit configuration according to claim 1, wherein in each of said stages, one of said supply terminals is to be applied to a positive potential and is connected to said second transistor, and the other of said supply terminals is to be applied to ground potential and is connected to said other terminal of said capacitor.

4. Circuit configuration according to claim 1, wherein each stage has a control input terminal acted upon by said control variable, and said first transistor of each stage has a gate terminal connected to said control input terminal.

5. Circuit configuration according to claim 4, wherein the control variable is a control current or control voltage.

6. Circuit configuration according to claim 1, wherein said decoupling stage has at least one inverter stage connected between said supply terminals.

7. Circuit configuration according to claim 1, including a control input terminal being acted upon by a variable dependent on a supply voltage of the ring oscillator, and a third transistor being connected parallel to said first transistor and having a gate terminal connected to said control input terminal.

8. Circuit configuration according to claim 4, including another control input terminal being acted upon by a variable dependent on a supply voltage of the ring oscillator, and a third transistor being connected parallel to said first transistor and having a gate terminal connected to said other control input terminal.

9. Circuit configuration according to claim 1, wherein said capacitor is an MOS transistor having a gate terminal forming one terminal of said capacitor and a short-circuited load path forming the other terminal of said capacitor.

10. Circuit configuration according to claim 1, wherein said transistors are NMOS transistors.

11. Circuit configuration according to claim 1, including a semiconductor body on which the circuit configuration is integrated.

12. Circuit configuration of an integratable and controllable ring oscillator for generating a clock signal, comprising:

first and second stages being interconnected between supply terminals, an inverter connected between said stages, and a terminal connected between said stages for supplying a clock signal;

each of said stages including first and second transistors having load paths connected between said supply terminals in a series circuit with a connecting point between said transistors, a capacitor connected between said connecting point and a fixed potential, and a decoupling stage connected to said connecting point.

* * * * *